United States Patent
Miyamoto et al.

(10) Patent No.: US 6,671,642 B2
(45) Date of Patent: Dec. 30, 2003

(54) METHOD OF EVALUATING ENERGY LOSS OF GOLF BALL

(75) Inventors: Kazuyoshi Miyamoto, Hyogo (JP); Masaki Shiraishi, Hyogo (JP)

(73) Assignee: Sumitomo Rubber Industries, Ltd., Kobe (JP)

( * ) Notice: Subject to any disclaimer, the term of this patent is extended or adjusted under 35 U.S.C. 154(b) by 0 days.

(21) Appl. No.: 10/183,159

(22) Filed: Jun. 28, 2002

(65) Prior Publication Data

US 2003/0008728 A1 Jan. 9, 2003

(30) Foreign Application Priority Data

Jun. 28, 2001 (JP) ......................... 2001-196472

(51) Int. Cl.⁷ .................. G01D 3/00; G01M 19/00; G01P 21/00; G01R 35/00; G06F 19/00
(52) U.S. Cl. .................. 702/109; 702/150; 702/155; 702/182; 702/97; 702/50; 473/351; 473/329; 473/321; 473/318; 473/199; 473/140; 428/364; 73/570; 73/866; 73/12.13; 73/12.04; 345/420; 345/423; 364/578; 703/212
(58) Field of Search ................... 702/109, 150, 702/155, 182, 50, 97; 473/329, 321, 318, 199, 140, 351; 428/364; 73/570, 866, 12.13, 12.04; 345/420, 423; 364/578; 703/212

(56) References Cited

U.S. PATENT DOCUMENTS

| | | | | | |
|---|---|---|---|---|---|
| 5,505,453 | A | * | 4/1996 | Mack | 473/329 |
| 5,586,940 | A | * | 12/1996 | Dosch et al. | 473/140 |
| 5,700,204 | A | * | 12/1997 | Teder | 473/199 |
| 5,739,411 | A | * | 4/1998 | Lee et al. | 73/12.13 |
| 5,759,113 | A | * | 6/1998 | Lai et al. | 473/321 |
| 5,931,746 | A | * | 8/1999 | Soong | 473/329 |
| 6,196,935 | B1 | * | 3/2001 | Spangler et al. | 473/318 |
| 6,431,996 | B1 | * | 8/2002 | Wright et al. | 473/318 |
| 2002/0028332 | A1 | * | 3/2002 | Pratt | 428/364 |
| 2002/0053232 | A1 | * | 5/2002 | Axe et al. | 73/12.04 |
| 2002/0189356 | A1 | * | 12/2002 | Bissonnette et al. | 73/570 |

* cited by examiner

*Primary Examiner*—John Barlow
*Assistant Examiner*—Aditya Bhat
(74) *Attorney, Agent, or Firm*—Birch, Stewart, Kolasch & Birch, LLP

(57) ABSTRACT

At step 1, a golf ball model is divided into a large number of elements composed of a large number of nodal points in the form of meshes; a physical property of a material for the golf ball is inputted; a simulation is executed by an analysis based on a finite element method, assuming that a golf club head collides with the golf ball; and a strain amount generated in the golf ball model at the time of the collision is computed. At step 2, a stress and a strain component of each element of the golf ball model and coordinate values of the nodal points of each element are outputted; and a value of a stress and a strain of each of six components of each element are computed momently. At step 3, the relationship between the stress and the strain of each component of each element is found from the value of the stress and the strain of each of the six components; and energy loss values of each element are computed. At step 4, the energy loss value is computed for all elements included in the golf ball model; the computed energy loss value is read by a visualizing software; and the energy loss of the golf ball model is visualized.

10 Claims, 19 Drawing Sheets

Fig. 1

Step 1

- A golf ball model is divided into a large number of elements composed of a large number of nodal points in the form of meshes.
- A physical property of a material for the golf ball is inputted.
- A simulation is executed by an analysis based on a finite element method, assuming that a golf club head collides with the golf ball.
- A strain amount generated in the golf ball model at the time of the collision is computed.

↓

Step 2

- A stress a strain component, a coordinate values of the nodal points of each element of the golf ball model are outputted. (or coordinate values of the nodal points necessary for an element coordinate conversion are outputted.)
- A value of a stress and a strain of each of six components of each element are computed momently. (or six components of each element in an element coordinate system are computed.)

↓

Step 3

- The relationship between the stress and the strain of each component of each element is found from the value of the stress and the strain of each of the six components; and energy loss values of each element are computed.

↓

Step 4

- An energy loss value is computed for all elements included in the golf ball model.
- The computed energy loss value is read by a visualizing software, and the energy loss of the golf ball model is visualized.
- A deformed configuration of golf ball model is visualized, based on coordinate values of the nodal points.

METHOD OF EVALUATING ENERGY LOSS OF GOLF BALL

BACKGROUND OF THE INVENTION

1. Field of the Invention

The present invention relates to a method of evaluating an energy loss of a golf ball. More particularly, the present invention is intended to visualize the energy loss generated in the interior of the golf ball not by making the golf ball as an experiment but by a simulation.

2. Description of the Related Art

The flight distance of the golf ball is one of its important performances demanded by a golfer. The golf ball that can fly a long distance gives the golfer a refreshing feeling and contributes to getting a high score. To increase the flight distance, it is necessary to improve the restitution performance of the golf ball.

Therefore in designing the golf ball, the restitution performance of the golf ball when it is hit is one of the main items that should be evaluated. Thus to improve the restitution performance of the golf ball, many proposals have been hitherto made.

Considered in one proposal is to pay attention to an energy loss generated in the interior of the golf ball when it is hit. More specifically, when a hitting object impacts (collides with) the golf ball, the golf ball deforms greatly and separates from the hitting object, thus generating a restitution. It is known that the restitution coefficient of the golf ball at this time is greatly affected by the energy loss generated in the interior of the golf ball when the hitting object collides with the golf ball.

It is also known that when the hitting object does not strike against the sweet spot of the golf ball, an energy generated at the time of the collision therebetween flees out of the golf ball and the energy is lost. The energy loss which occurs in the interior of the golf ball when the hitting object collides with the golf ball affects the flight distance of the golf ball greatly. Thus the information of the energy loss is useful for improving the restitution performance of the golf ball.

However, since it is very difficult to observe the interior of the golf ball at the time of the collision (impact) between the hitting object and the golf ball, it is impossible to evaluate the energy loss generated in the interior of the golf ball when the hitting object impacts the golf ball. Therefore it is impossible to estimate and observe a portion (for example, a portion of the cover of the golf ball or the center thereof) of the interior of the golf ball and the extent of the generated energy loss. That is, the conventional art is incapable of sufficiently utilizing the energy loss in improving the restitution performance of the golf ball.

In the conventional method of designing the golf ball, a material composing the golf ball is determined, the golf ball is manufactured as an experiment, and the manufactured golf ball is actually hit. In this manner, the restitution performance of the designed golf ball is evaluated. The conventional designing method has a problem that much cost and time are required in the trial manufacture.

SUMMARY OF THE INVENTION

The present invention has been made in view of the above-described problem. Thus, it is an object of the present invention to provide a method capable of evaluating an energy loss generated in the interior of a golf ball when an actual hitting object collides (impacts) with the golf ball to improve the restitution performance of the golf ball and facilitate designing thereof.

To achieve the object, the present invention provides a method of evaluating an energy loss of a golf ball, having the steps of dividing a golf ball model into a large number of elements composed of a large number of nodal points in the form of meshes; inputting a physical property of a material for the golf ball; executing a simulation by an analysis based on a finite element method, assuming that a golf club head collides with the golf ball; and computing a strain amount generated in the golf ball model at the time of the collision (first step);

outputting a stress and a strain component of each element of the golf ball model and coordinate values of the nodal points of each element; and momently computing a value of a stress and a strain of each of six components of each element (second step);

finding a relationship between the stress and the strain of each component of each element from the value of the stress and said strain of each of the six components; and computing energy loss values of each element (third step); and computing the energy loss value for all elements included in the golf ball model; reading the computed energy loss value by a visualizing software; and visualizing the energy loss of said golf ball model (fourth step).

As described above, by visualizing and observing the state of the energy loss generated in the interior of the golf ball when the hitting object collides with the golf ball, it is possible to evaluate the energy loss affecting the restitution performance of the golf ball in a high extent. Thereby it is possible to obtain information useful for improving the restitution performance in designing the golf ball. Therefore it is possible to design the golf ball superior in its restitution performance.

By three-dimensionally visualizing and displaying the energy loss of each element computed by the above-described method, it is possible to estimate and observe the interior portion of the golf ball where the energy loss is generated and the extent of the generated energy loss. The energy loss means the loss of a deformation (hysteresis) of each component of each element.

Since a simulation is executed by using the finite element method, it is possible to save the cost and time necessary for trial manufacture and achieve designing of the golf ball having various constructions by using various materials in a short period of time.

A golf ball model is divided into a large number of elements composed of a large number of nodal points in the form of meshes; a physical property of a material for the golf ball is inputted; a simulation is executed by an analysis based on a finite element method, assuming that a golf club head collides with the golf ball; and a strain amount generated in the golf ball model at the time of the collision is computed.

In executing the analysis based on the finite element method, an initial condition is set on the golf ball model. More specifically, the initial condition includes the size, configuration, construction, and physical property of the golf ball model; and the speed, configuration, construction, and physical property of an object (for example, golf club head model) which collides with the golf ball model.

A stress and a strain component of each element of the golf ball model and coordinate values of the nodal points of each element are outputted; and a value of a stress and a strain of each of six components of each element are computed momently.

In a three-dimensional space, each of the strain and the stress is constituted of three components in a vertical direction and three components in a shear direction, namely, six components in total. Therefore in the simulation executed by the finite element method, the energy loss of each of the elements constituting the golf ball model is computed for the six components. Thereby it is possible to execute an analysis in almost the same state as that generated in the collision between the actual hitting object and the golf ball. Thus the simulation can be accomplished with high accuracy.

In executing the simulation by using the finite element method, the element coordinate system may be used as the coordinate system constituting the reference of the three components of the stress and the strain of each element of the golf ball model in each of the vertical and shear directions in a three-dimensional space. That is, coordinate values of the nodal points of each element necessary for an element coordinate conversion may be outputted; and a value of a stress and a strain of each of six components of each element in an element coordinate system may be computed momently. The coordinate axis moves owing to a rotary movement generated in each element of the golf ball caused by a deformation of the golf ball at the time of the collision between the golf ball and the hitting object. Thus the element coordinate system allows the coordinate axis to move according to the rotary movement of each element. Thereby it is possible to eliminate the influence caused by the rotation of the element and consider only the deformation of the golf ball.

In the case where the element of the golf ball model has the rotary movement owing to the collision between the golf ball model and the hitting object, the influence of the rotary movement of the element of the golf ball is included in a computation performed to find the energy loss by executing the analysis of the six components, based on the finite element method when the element coordinate system is not used but an entire coordinate system is used. In the case where the influence of the rotary movement is removed and energy loss in each direction are computed, the three components in each of the vertical direction and the shear direction in the element coordinate system are computed to find the energy loss favorably.

The relationship between the stress and the strain of each component of each element is found from the value of the stress and the strain of each of the six components; and energy loss values of each element are computed.

More specifically, a stress-strain curve is drawn momently from the relationship between the stress and the strain of each component of each element. A point at which the absolute value of the strain is maximum is found from the stress-strain curve. Thereafter a point at which the absolute value of the strain is maximum is found to compute a work amount done during an increase in the amount of the strain from zero to the maximum absolute value thereof in relation to the time of the collision between the actual hitting object and the golf ball model, and also compute a work amount done in a strain-decrease direction, namely, the work amount done during a decrease in the amount of the strain from its maximum absolute value to zero. The value of the energy loss can be computed from these two work amounts.

Because each of the six components has an energy loss value, the total of the energy loss values of the six components is the energy loss value of the element.

The energy loss value is computed for all elements included in the golf ball model; the computed energy loss value is read by a visualizing software; and the energy loss of the golf ball model is visualized.

As a method of realizing the visualization of the energy loss, a visualizing software "ensight" and the like can be used. This software allows energy losses of each ball-constituting element to be displayed in different colors on a view (contour view).

In visualizing the energy loss, a deformed configuration of the golf ball model is displayed based on coordinate values of nodal points of each element. Thereby it is possible to visualize the energy loss of the golf ball and the configuration thereof at the time of the collision between the golf club head and the golf ball. Thus the method of the present invention is effective for designing the golf ball.

To visualize the energy loss, it is preferable to realize the visualization by classifying different energy loss values by color (color is gradually changed from a warm color to a cold color in dependence on energy loss values) and displaying the difference in energy losses in different colors on the contour view. Thereby it is possible to evaluate the energy loss at a look and clearly.

In measurement which is conducted by the split Hopkinson's bar tester, a specimen can be strained in a high extent and at a high speed. Therefore the physical property of a material composing the golf ball can be measured in a condition of a strain, a strain speed, and a stress equivalent to those generated in the material when the golf ball is actually hit with an actual golf club head. By using the material having the physical property measured by split Hopkinson's bar tester, it is possible to simulate the state of a strain and a stress to which the material of the golf ball is subjected, by executing an analysis based on the finite element method. Thus it is possible to visualize the energy loss of the golf ball with high accuracy.

It is preferable to execute the analysis by using a material having a physical property measured in a condition in which its maximum compression strain is 0.05–0.50 and its maximum strain speed is 500/s to 10000/s and favorably 500/s–5000/s, in supposition of a maximum compression strain and a maximum strain speed to be generated when the golf ball is hit with the golf club head. Since the material is measured in the condition of the strain and the strain speed to be generated in a high extent and at a high speed, the evaluation method of the present invention is capable of improving evaluation accuracy.

Needless to say, the physical property of the material for the golf ball model may be measured by a measuring method other than the split Hopkinson's bar tester, provided that the measuring method is capable of straining a specimen in a high extent and at a high speed and measuring the physical property in the condition of the maximum compression strain and the maximum strain speed equivalent to those to be generated when the golf ball is actually hit with an actual golf club head.

As the physical properties of a material which are used for the analysis based on the finite element method, it is preferable to use those relating to rigidity and viscosity thereof such as Young's modulus, a shear coefficient, a viscosity coefficient, a loss factor, and the like. It is possible to evaluate the energy loss of the golf ball with high accuracy by using any one of the above-described physical properties or a combination thereof for the analysis based on the finite element method.

In the finite element method, the object (golf ball model) to be analyzed is divided into a large number of elements in the form of mesh. It is favorable to divide the entire golf ball model into 1000–100000 elements, more favorable 25000–60000 elements and very more favorable 25000–20000 elements. The upper limit value is set in view of the capability of a computer currently available. As the capability of the computer is improved, the time required to execute the analysis based on the finite element method is reduced. Thus needless to say, the upper limit value can be changed.

It is preferable that the element is a hexahedron. In view of analysis accuracy, it is favorable that the element is as small as possible. However, the smaller the element is, the longer it takes to perform a computation.

For example, the following method of defining or determining the finite element method is preferable: A first axis of the element coordinate is determined from two nodal points included in the element. Then a plane is defined with the first axis and another nodal point. A line orthogonal to the first axis and normal to the plane α is set as a second axis. An axis vertical to both the first axis and the second axis is set as a third axis. The element coordinate is determined with the first axis, the second axis, and the third axis.

The method of the present invention is capable of simulating a so-called one-piece golf ball consisting of one layer such as cross-linked rubber layer, a so-called two-piece golf ball composed of two layers such as the cross-linked rubber layer and a cover covering the cross-linked rubber layer, and a so-called multi-piece golf ball composed of three or more layers. That is, the method of the present invention is capable of simulating golf balls having any structure.

Any kind of material which is used for the golf ball can be used as the material for the golf ball which is simulated by the present invention. The material may contain various additives. That is, it is possible to apply a material whose physical property necessary for the analysis based on the finite element method can be measured to the golf ball which is simulated by the present invention.

BRIEF DESCRIPTION OF THE DRAWINGS

FIG. 1 is a flowchart showing the energy loss evaluation method of the present invention.

FIG. 3 shows a state of a model in a simulation, assuming that a hollow bar model made of aluminum collides with a golf ball model, in which

DETAILED DESCRIPTION OF THE PREFERRED EMBODIMENTS

The embodiment of the present invention will be described below with reference to the drawings.

FIG. 1 shows a flowchart of the simulation method of the present invention.

Step 1: A golf ball model is divided into a large number of elements composed of a large number of nodal points in the form of meshes; a physical property of a material for the golf ball is inputted; a simulation is executed by an analysis based on a finite element method, assuming that a golf club head collides with the golf ball; and a strain amount generated in the golf ball model at the time of the collision is computed.

Step 2: A stress and a strain component of each element of the golf ball model and coordinate values of the nodal points of each element are outputted; and a value of a stress and a strain of each of six components of each element are computed momently.

Step 3: The relationship between the stress and the strain of each component of each element is found from the value of the stress and the strain of each of the six components; and energy loss values of each element are computed.

Step 4: The energy loss value is computed for all elements included in the golf ball model; the computed energy loss value is read by a visualizing software; and the energy loss of the golf ball model is visualized.

There by it is possible to evaluate the energy loss affecting the restitution performance of the golf ball. The obtained information of the energy loss is useful for improving the restitution performance in designing the golf ball.

At step 1, the golf ball model is divided into a large number of elements composed of a large number of nodal points in the form of meshes; a physical property of a material for the golf ball is inputted; a simulation is executed by an analysis based on a finite element method, assuming that a golf club head collides with the golf ball; and a strain amount generated in the golf ball model at the time of the collision is computed.

Figure 2:
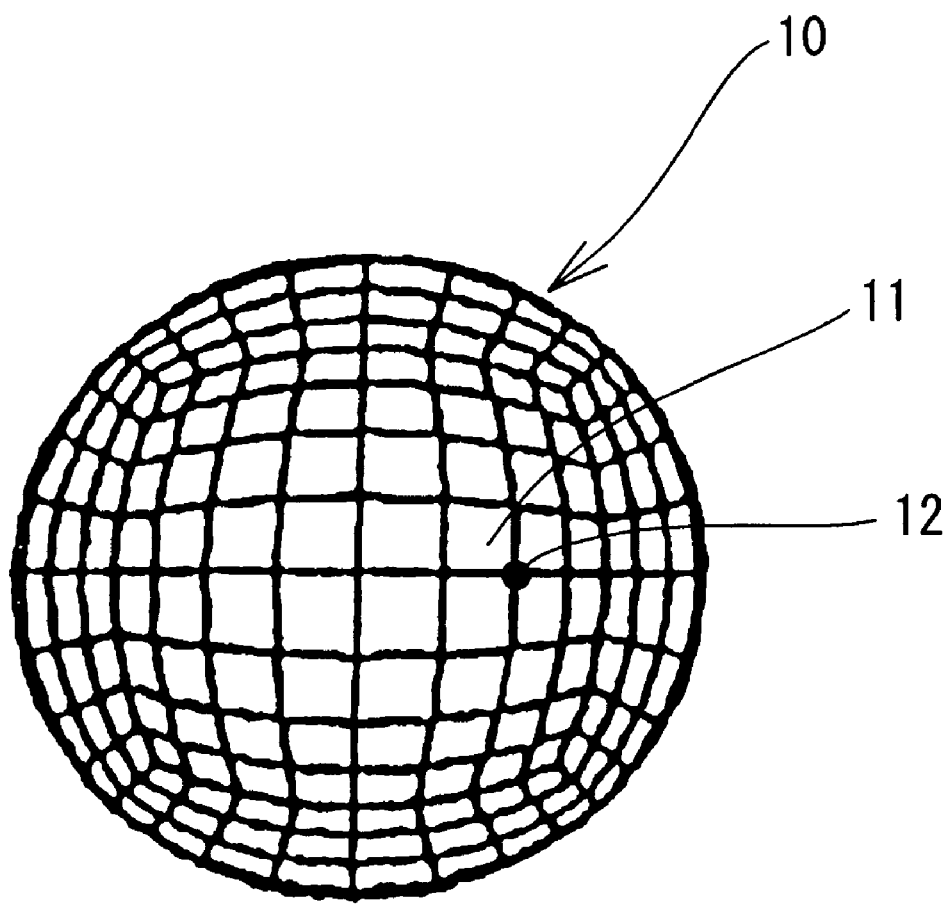
FIG. 2 is a schematic view of a golf ball model to be simulated by the energy loss evaluation method of the present invention.

FIG. 2 shows a golf ball model 10 to be simulated by the simulation method of the present invention. As shown in FIG. 2, the diameter of the golf ball model 10 is set to 42.8 mm in an assumption of a one-piece ball containing high-cis polybutadiene rubber as its main component.

In executing the analysis based on the finite element method, an initial condition of the golf ball model 10 to be analyzed is set. More specifically, the initial condition such as the size, configuration, construction, and physical property, and the like of the golf ball model 10 is set. The golf ball model 10 is divided into a large number of mesh elements 11 in the form of meshes to obtain a large number of nodal points 12. In the embodiment, the golf ball model 10 is divided into 3200 elements 11. The element 11 is a hexahedron. The size of the element 11 is 1.25 mm–5.62 mm. The volume of the element 11 is 1.95 mm$^3$–63.1 mm$^3$. The lattice-shaped lines of FIG. 2 indicate meshes.

Based on the set condition, the amount of a strain generated in the golf ball model 10 in a predetermined in relation to the time of the collision between the hitting object and the golf ball model 10 is computed.

A split Hopkinson's bar tester which will be described later measures the physical property of a material containing the high-cis polybutadiene rubber as its main component. Thereby it is possible to obtain the physical property of the material in the condition of a strain and a strain speed equivalent to those generated in the golf ball when it is hit with an actual golf club head.

The physical property of the material is inputted, and the simulation is executed by the analysis based on the finite element method.

Figure 3A:
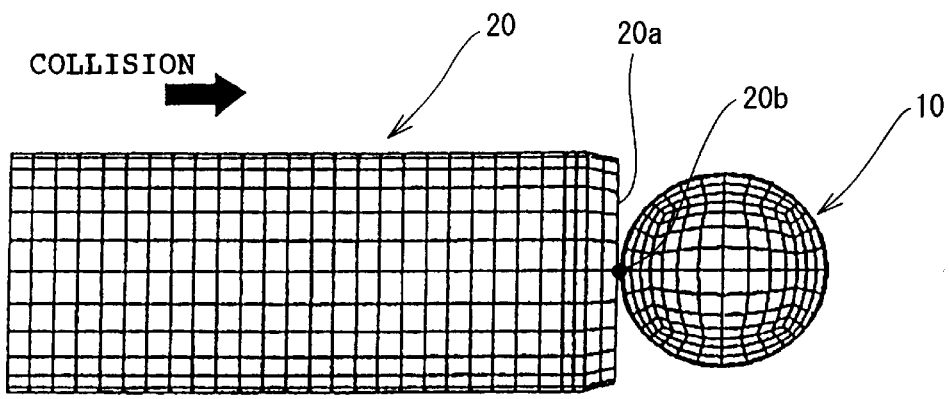
FIG. 3A shows a state before the hollow bar model collides with the golf ball model.
Figure 3B:
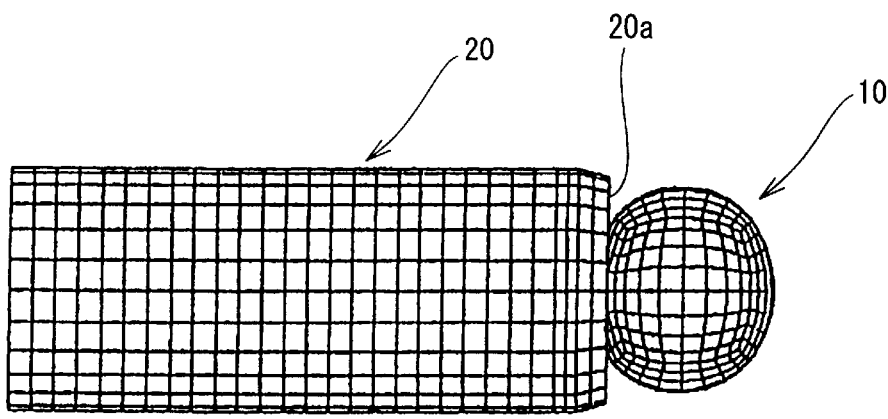
FIG. 3B shows a state when the hollow bar model collides with the golf ball model.
Figure 3C:
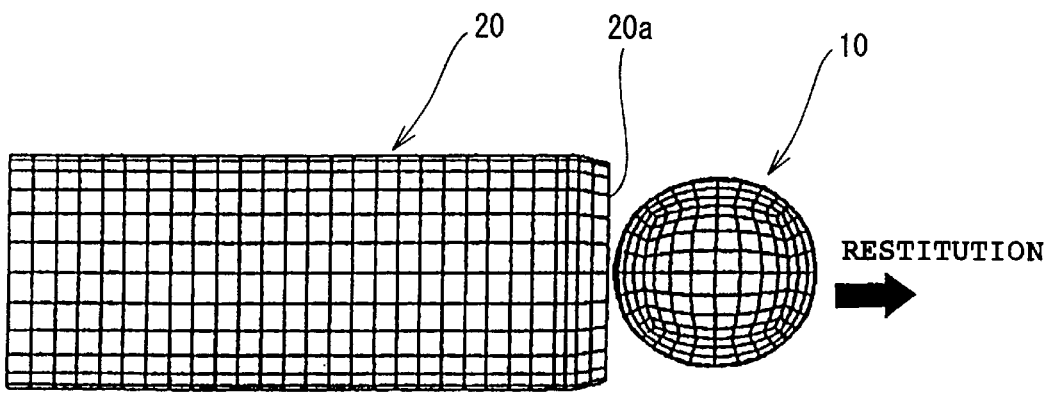
FIG. 3C shows a state after the hollow bar model collides with the golf ball model.

More specifically, as shown in FIGS. 3A, 3B, and 3C, a simulation is conducted, assuming that the golf club head (hitting object) collides with the golf ball. That is, the state of the golf ball model 10 is analyzed by the finite element method, when a cylindrical hollow bar model 20, made of aluminum, having a weight of 200 g (same as the weight of the golf club head) collides with the golf ball model 10 at a speed of 45 m/s. Thereby a computation is performed to find the amount of a strain generated in each element 11 of the golf ball model 10 in a predetermined period of time in relation to the time of the collision between the golf ball model 10 and the cylindrical hollow bar model 20.

A circular surface 20a of the cylindrical hollow bar model 20 made of aluminum collides with the golf ball model 10. The circular flat surface 20a of the cylindrical hollow bar model 20 collides head-on with the golf ball model 10. A central point 20b of the circular surface 20a of the cylindrical hollow bar model 20 collides first with the golf ball model 10.

At step 2, a stress and a strain component of each element of the golf ball model and coordinate values of the nodal points of each element are outputted; and a value of a stress and a strain of each of six components of each element are computed momently.

Initially from the result obtained by the analysis based on the finite element method, computations are performed to find a stress and a strain component generated momently in each element 11 of the golf ball model 10 owing to the collision between the golf ball model 10 and the hitting object (hollow bar model 20 made of aluminum) and coordinate data (coordinate value of nodal point) of a nodal point 12 of each element 11.

Thereafter from the computed value, the value of the stress and strain of each element 11 are momently computed in six components described below. Each of the strain and the stress of each element 11 is constituted of three components in a vertical direction and three components in a shear direction. Therefore the value of the stress and strain of each element 11 is computed in the six components.

Figure 4A:
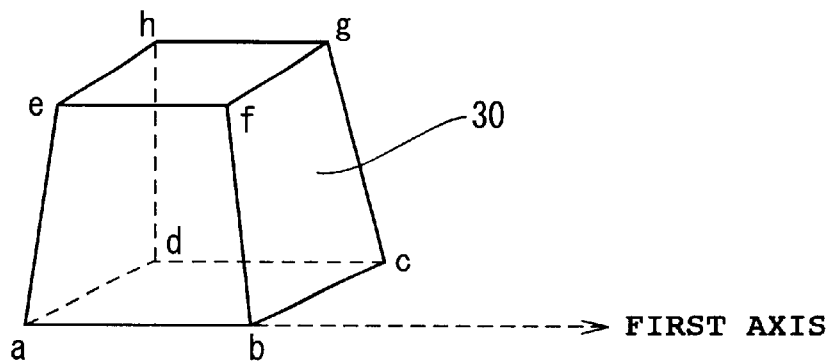
FIGS. 4A, 4B, and 4C are a schematic view showing a method of determining a element coordinate respectively.
Figure 4B:
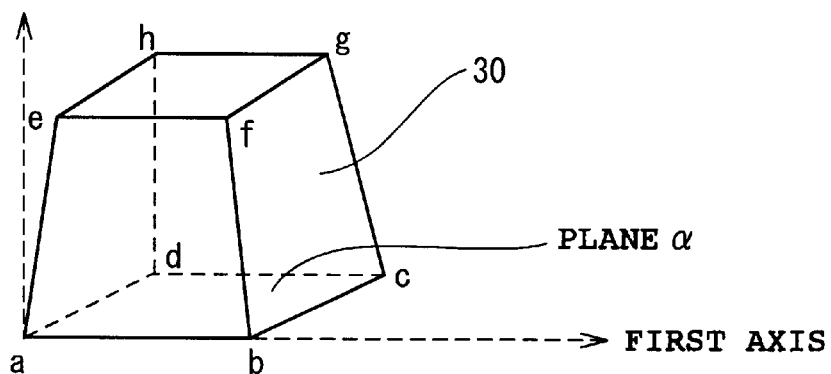
Figure 4C:
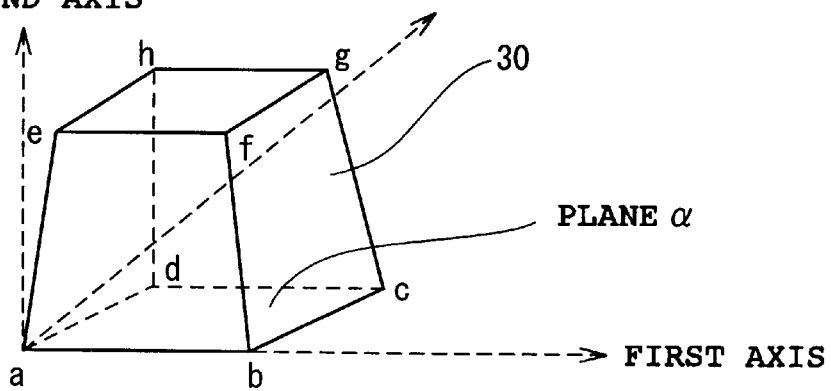

Coordinate values of the nodal points of each element necessary for an element coordinate conversion may be outputted; and a value of a stress and a strain of each of six components of each element in an element coordinate system may be computed momently. As a method of defining the element coordinate system, the method of determining the element coordinate of a hexahedral element 30 is shown in FIGS. 4A, 4B, and 4C.

Initially two nodal points (in the embodiment, nodal points a and b) are selected from among eight nodal points a–h constituting the hexahedral element 30. A straight line passing through the two nodal points a and b is set as a first axis of the element coordinate.

A plane α is defined with the nodal point c and the first axis (face abcd forms the plane α). A line passing through the nodal point a and normal to the plane α is set as a second axis.

An axis vertical to both the first axis and the second axis is set as a third axis. The element coordinate is determined by the first axis, the second axis, and the third axis.

In the embodiment, the element coordinate maybe determined by the above-described method. In the element coordinate system, energy loss of each components removing the infuuence of rotary movement can be computed when the element of the golf ball model makes a rotary movement.

At step 3, the relationship between the stress and the strain of each component of each element is found from the value of the stress and the strain of each of the six components; and energy loss values of each element are computed.

A example of the method of computing the energy loss is described below. The energy loss can be computed by finding the loop area of stress-strain curve except below method.

Initially, using the value of each of the stress and strain of each of the six components of each element momently computed at step 2, the relationship between the stress and the strain is shown in a graph.

Figure 5:
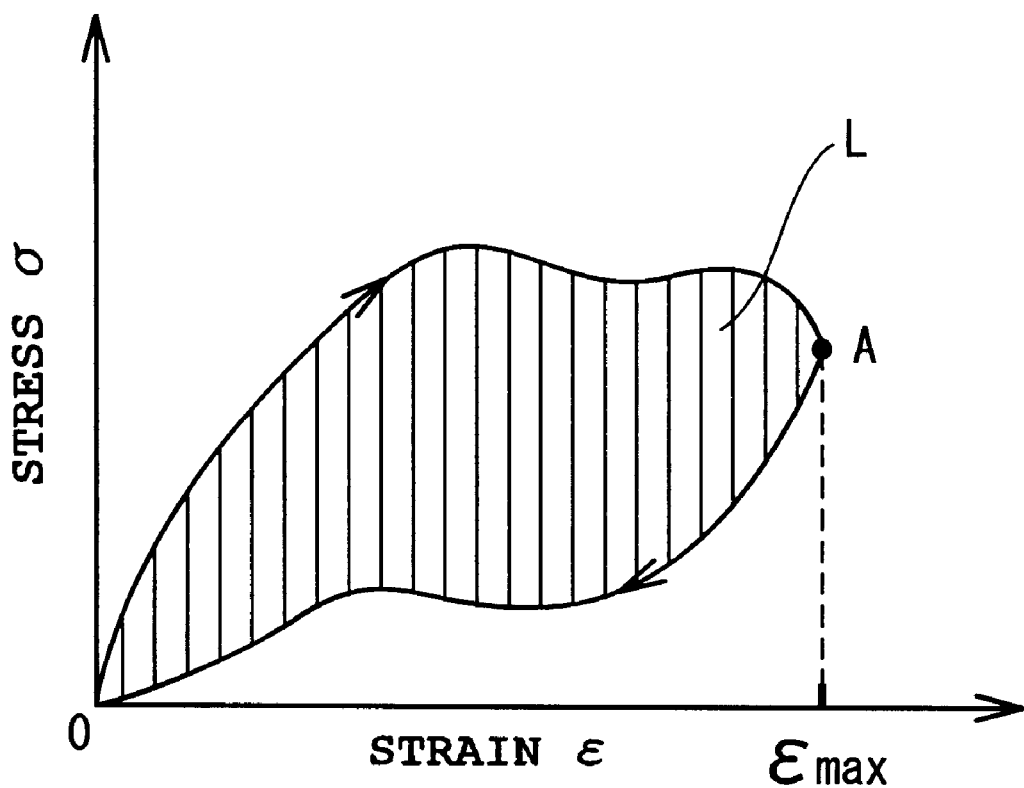
FIG. 5 shows the relationship between a stress and a strain of one component of one element of the golf ball model.

That is, in the simulation which is executed by the analysis based on the finite element method, each component of each element 11 constituting the golf ball model 10 shows the relationship (stress-strain curve) between the strain and the stress as shown in FIG. 5 in the process where the material of the hitting object (cylindrical hollow bar model 20 made of aluminum) collides with the golf ball model 10 and is subjected to the stress to generate the strain and returns to its original state. In FIG. 5, the abscissa indicates the strain, whereas the ordinate indicates the stress. FIG. 5 shows the relationship between the strain and the stress of one component of one element of the golf ball model 10.

The curve of FIG. 5 indicating the relationship between the strain and the stress goes momently from a point O to a point A (where the absolute value of the strain takes a maximum value $\epsilon_{max}$) and returns to the point O.

A difference (a portion shown with vertical lines) is generated between a work amount done while the curve goes from the point O to the point A and a work amount done while the curve returns from the point O to the point A. Based on the value of the difference (area shown with the vertical line) between the above-described two work amounts, it is possible to find the energy loss generated when the hitting object collides with the golf ball. The difference between the work amounts is generated in each component of each element 11 constituting the golf ball model 10.

To find the difference between the work amounts, regarding the stress and the strain of each component of each element 11, a work amount done while the value of the strain increases from zero to the maximum value $\epsilon_{max}$ of the absolute value is computed.

Figure 6:
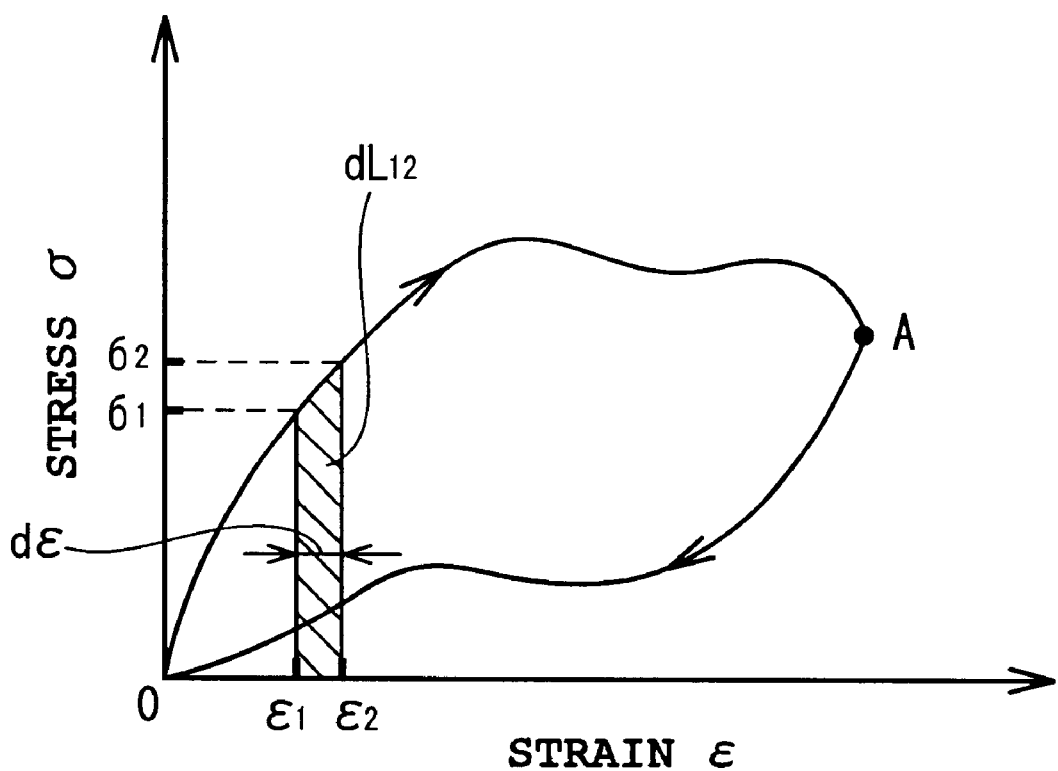
FIG. 6 shows a method of computing a work amount when an amount of a strain generated in the element increases.

More specifically, as shown in FIG. 6, in the process of the movement (increase in the amount of the strain) of the stress-strain curve from the point O to the point A, a work amount (area of a portion shown with oblique lines in FIG. 6) $dL_{12}$ done while the strain changes by $d\epsilon$ from $\epsilon 1$ (stress: $\sigma 1$) to $\epsilon 2$ (stress: $\sigma 2$) is computed by using an equation (1) shown below.

(Equation 1)

$$dL_{12}=\tfrac{1}{2}(\sigma 1+\sigma 2)\cdot d\epsilon \qquad (1)$$

Figure 7:
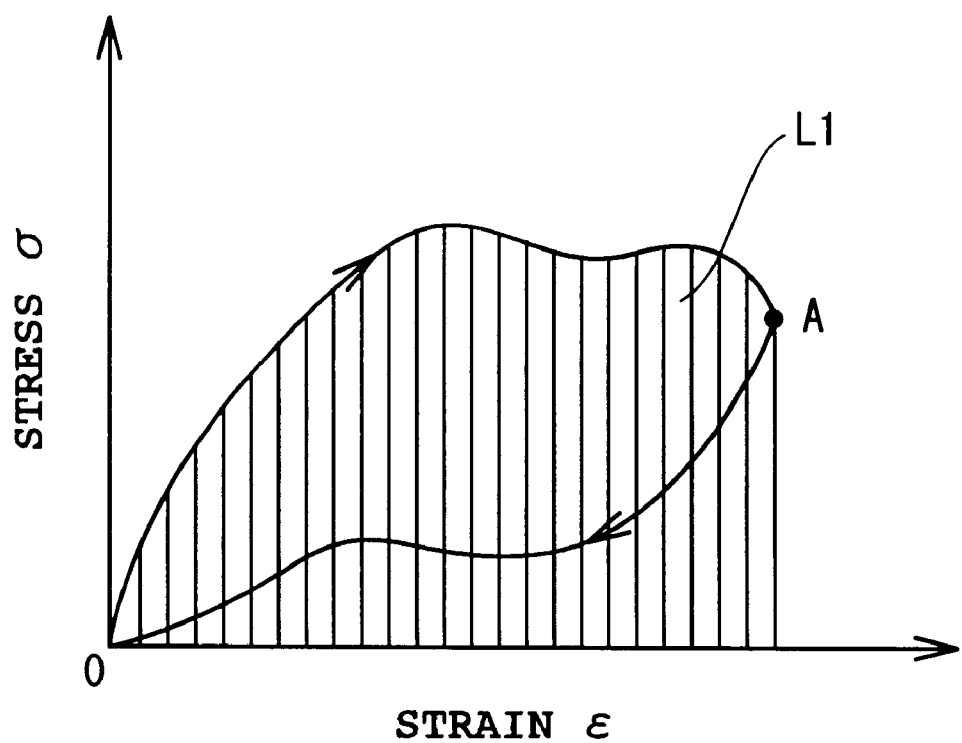
FIG. 7 shows a sum total of work amounts when the amount of the strain generated in the element increases.

By using a method similar to the above-described method, a work amount done while the strain changes by $d\epsilon$ from the point O to the point A is found. Then the total of the work amounts is computed. That is, a computation is performed to determine the sum total L1 (work amount indicated with vertical lines of FIG. 7) of the work amounts done during the movement of the stress-strain curve from the point O to the point A.

Thereafter regarding the stress and strain of each component of each element 11, a computation is performed to find a work amount L2 done in a strain-decrease direction, namely, the work amount L2 done during a decrease in the amount of the strain from the point A (maximum value $\epsilon_{max}$ of absolute value of strain) to the proximity of zero.

Figure 8:
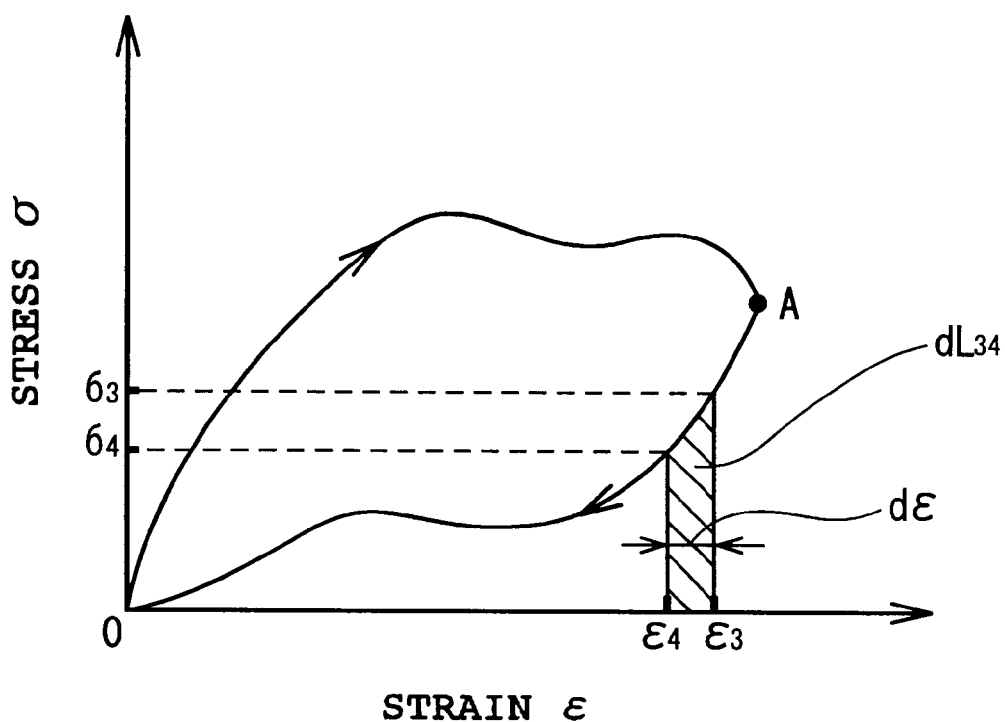
FIG. 8 shows a method of computing a work amount when the amount of the strain generated in the element decreases.

More specifically, as shown in FIG. 8, in the process of the movement (decrease in the amount of the strain) of the stress-strain curve from the point A to the point O, a work amount (area of a portion shown with oblique lines in FIG. 8) $dL_{34}$ done while the strain changes by $d\epsilon$ from $\epsilon 3$ (stress: $\sigma 3$) to $\epsilon 4$ (stress: $\sigma 4$) is computed by using an equation (1) shown below.

(Equation 2)

$$dL_{34}=\tfrac{1}{2}(\sigma 3+\sigma 4)\cdot |d\epsilon| \qquad (2)$$

Figure 9:
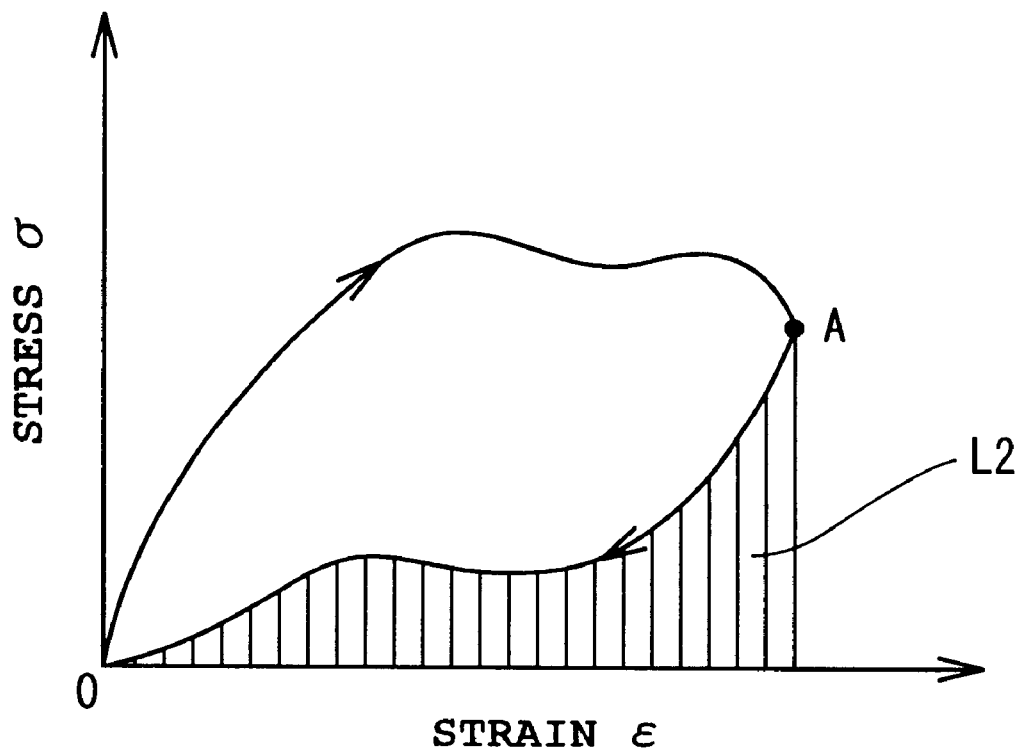
FIG. 9 shows a sum total of work amounts when the amount of the strain generated in the element decreases.

By using a method similar to the above-described method, a work amount done while the strain changes by $d\epsilon$ from the point A to the point O is found. Then the total of the work amounts is computed. That is, a computation is performed to determine the sum total L2 (work amount indicated with vertical lines of FIG. 9) of the work amounts done during the movement of the stress-strain curve from the point A to the point O.

The difference L (area shown with vertical lines in FIG. 5) in the work amounts is computed by using an equation (3) shown below based on the sum total L1 of the work amounts done during the movement of the stress-strain curve from the point O to the point A and the sum total L2 done during the movement of the stress-strain curve from the point A to the point O. The sum totals L1 and L2 are found by the above-described method.

(Equation 3)

$$L=L1-L2 \qquad (3)$$

As shown by an equation (4) shown below, the energy loss of each component of each element 11 can be computed by the pbaruct of the value of the work amount difference L and a volume V of each element 11 in its initial configuration.

(Equation 4)

$$\text{Energy loss}=L\cdot V \qquad (4)$$

Because each of the six components has an energy loss value, the energy loss value of each of the six components is computed by a method similar to the above-described method. The total of the energy loss values of the six components is the value of the energy loss of the element 11.

At step 4, the energy loss value by the volume is computed for all elements included in the golf ball model; the computed energy loss value is read by a visualizing software; and the energy loss of the golf ball model is visualized The method of visualizing the energy loss is described below.

The energy loss value of each element 11 computed at step 3 is read by the visualizing software.

Figure 10:
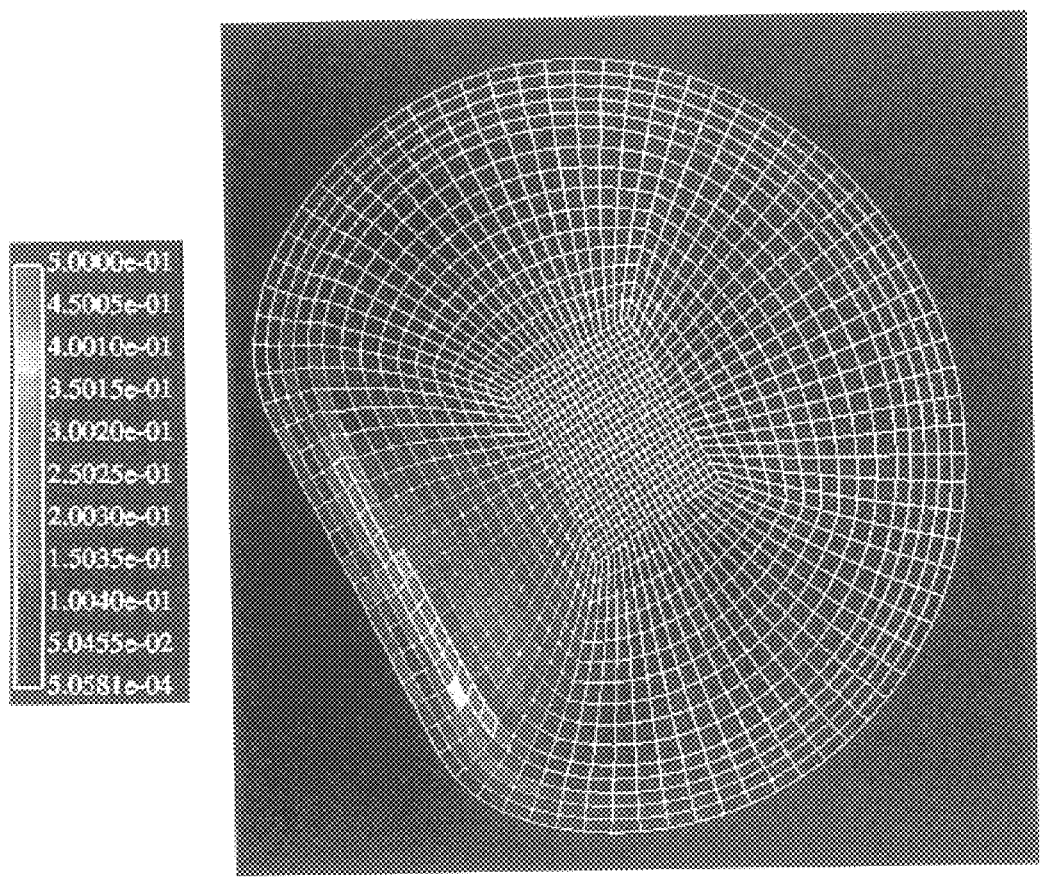
FIG. 10 shows a state in which an energy loss of each element of the golf ball model when a hitting object collides with the golf ball model.

Thereafter as shown in FIG. 10, energy losses of each element of the golf ball model 10 are shown on a contour view (sectional view) to visualize the energy losses generated inside the golf ball model 10.

More specifically, in the golf ball model 10, display regions are set in dependence on energy loss values to show the state of the interior of the golf ball. That is, a region having the greatest energy loss is set as a region (red), and a region having the smallest energy loss is set as a region (bule). Other regions (other color) are set sequentially in dependence on the energy loss values thereof and displayed on a section of the golf ball.

Based on the coordinate data (coordinate value of nodal point) of the nodal points 12 of each element 11 obtained by the analysis, a deformed configuration of the golf ball model 10 is also displayed to also visualize the configuration of the golf ball model 10 at the time of the collision between the hitting object and the golf ball model 10.

From the above, it is possible to estimate and observe an interior portion of the golf ball where the energy loss has been generated at the time of the collision between the hitting object and the golf ball and the extent of the generated energy loss. It is also possible to estimate the deformed configuration of the golf ball.

In visualizing the energy loss, it is optimum to realize the visualization by classifying the energy loss values of each element by color and displaying the difference in the energy losses in different colors on the contour view. For example, it is possible to evaluate the extent of energy loss values at a glance by displaying the energy of each element of FIG. 10 in different colors. In the embodiment, the interior state of the golf ball is displayed by dividing the golf ball model 10 into other color regions in dependence on energy loss values to show the interior state of the golf ball. However, it is possible to appropriately set the number of display regions and the range of the energy loss value in each region.

Figure 11:
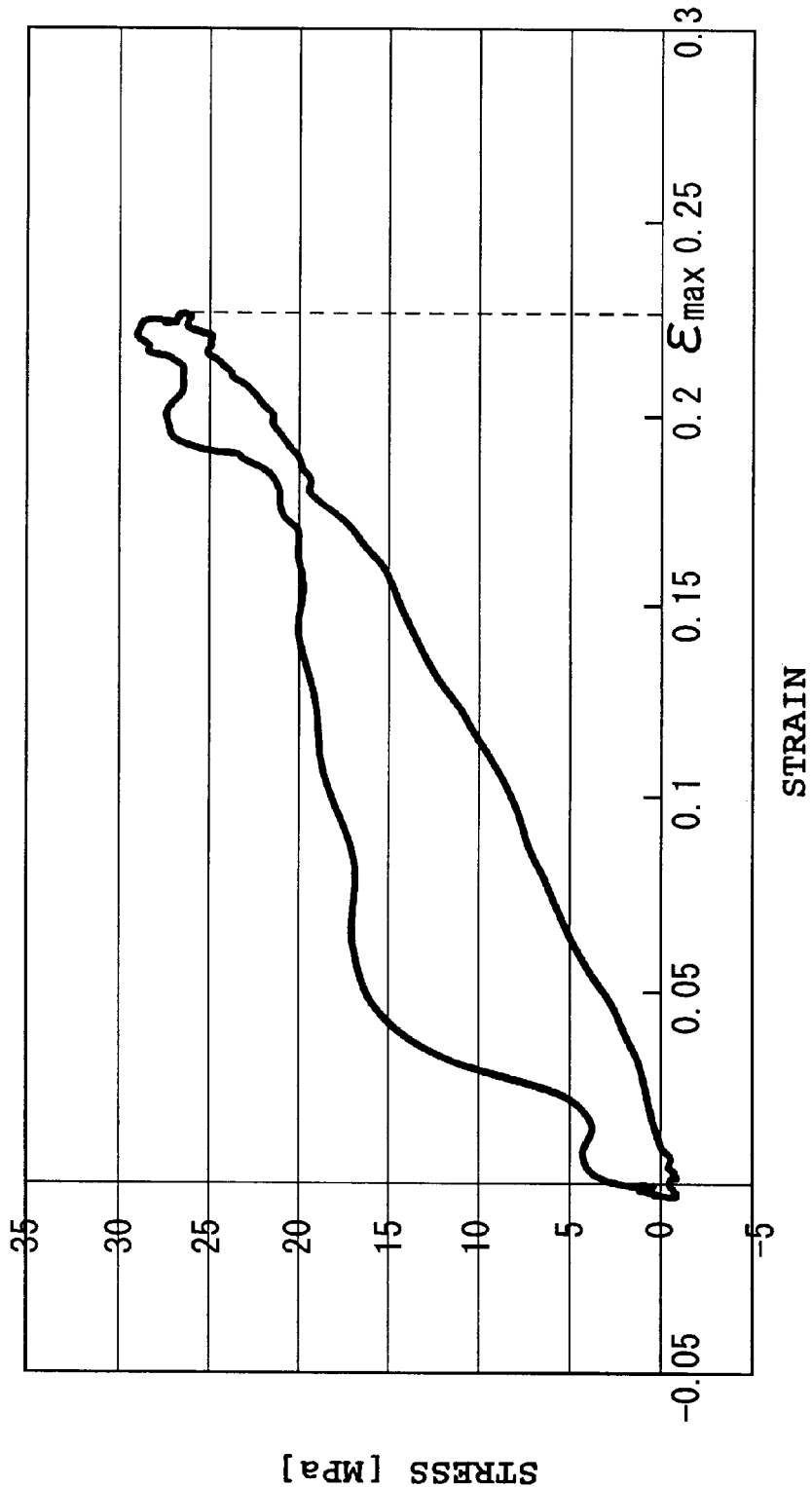
FIG. 11 shows a stress-strain curve of one of elements of the golf ball model in one direction of an element coordinate system.
Figure 12:
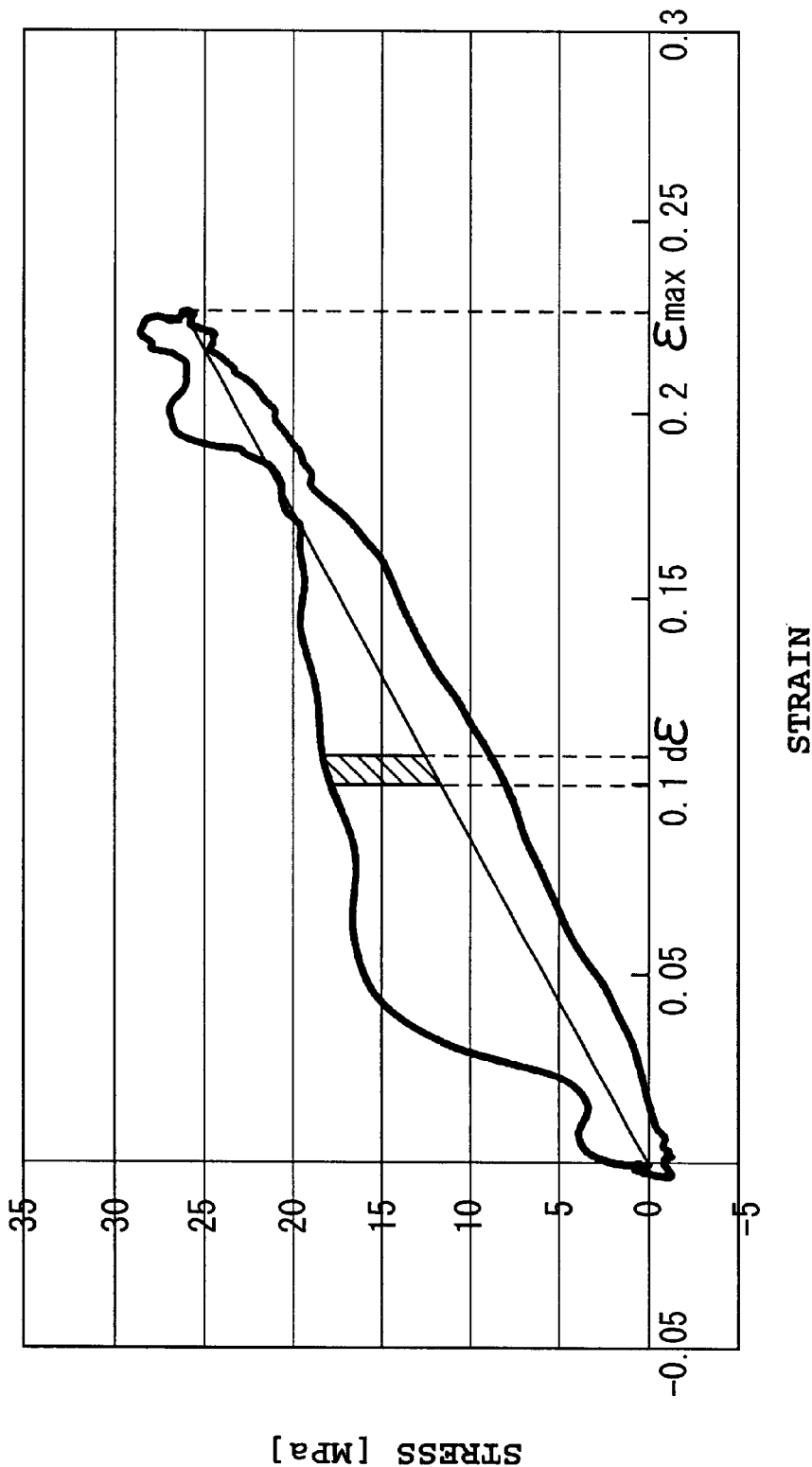
FIG. 12 shows a method of computing an energy loss when a strain has proceeded by dε from 0.1.
Figure 13:
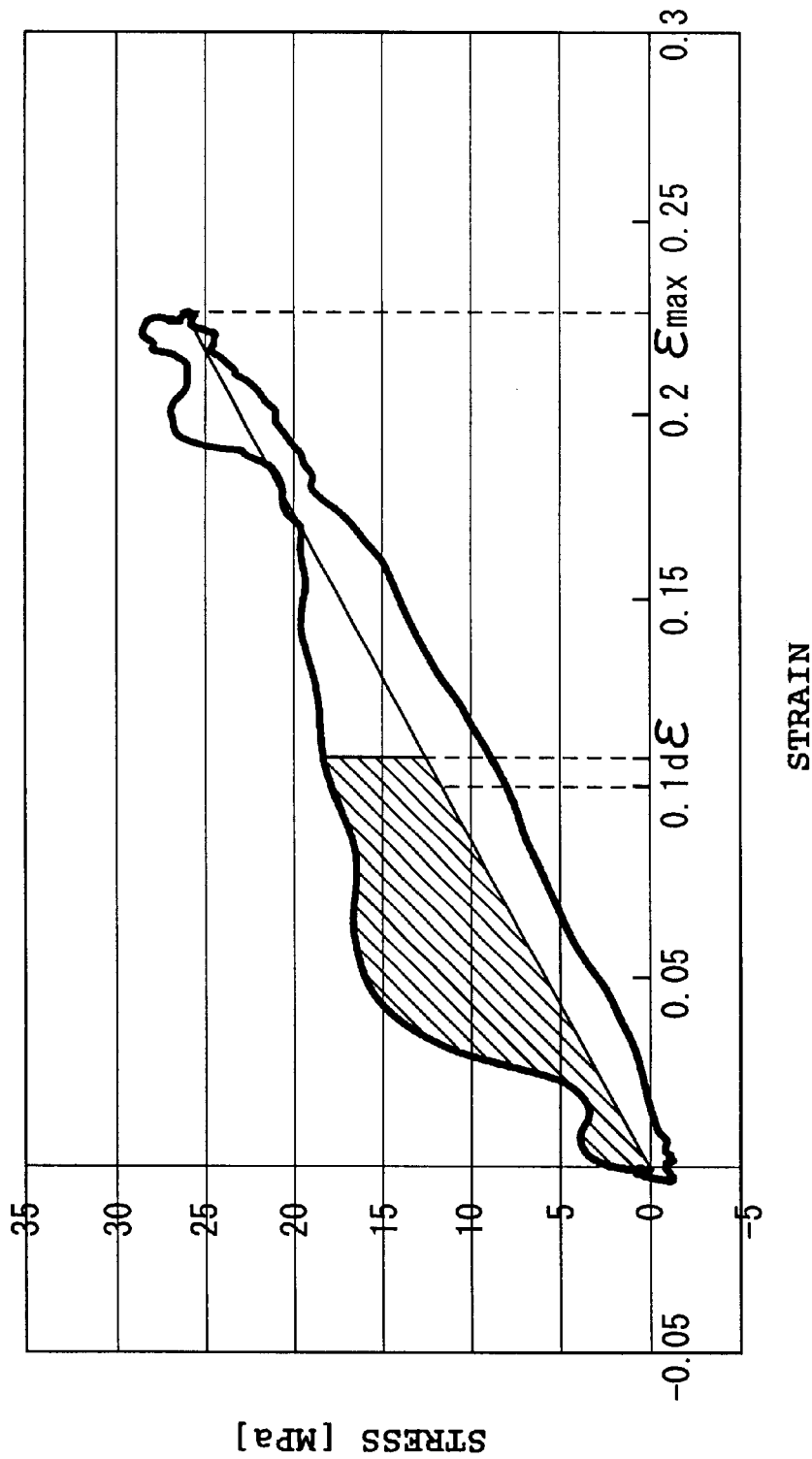
FIG. 13 shows a method of computing an energy loss when the strain has proceeded by (0.1+dε) from zero.

In addition to the above-described method of computing the energy loss, the following method can be also used:

FIG. 11 shows a stress-strain curve of one of the elements of the golf ball model in one direction of the element coordinate system. A maximum value $\epsilon_{max}$ of the strain is determined from the curve of FIG. 11. Thereafter as shown in FIG. 12, an energy loss when the strain has proceeded by $d\epsilon$ from 0.1 is drawn in a range shown with oblique lines, and the area of the oblique lines is computed. Therefore an energy loss when the strain has proceeded by $(0.1+d\epsilon)$ from zero can be computed in the range shown with oblique lines shown in FIG. 13. In this manner, it is possible to compute the energy loss before the stress-strain curve returns to the proximity of zero. This method allows the computation of the energy loss generated in a range from zero to a certain point during the deformation of the golf ball model 10. In the case the strain loop is not closed, if the strain is small to the degree of 0%–20% strain of the absolute value of maximum strain, favorably 0%–10%, more favorably 0%–5%, the energy loss can be computed by calculating the hysteresis loss.

In the embodiment, one-piece golf ball model is simulated. In addition, the method of the present invention is capable of simulating a two-piece golf ball and a multi-piece golf ball composed of three or more layers by the finite element method and visualizing the energy loss. That is, the method of the present invention is capable of simulating golf balls having any structure.

The method of the present invention is capable of simulating the golf ball made of any kind of material, provided that the physical property of the material can be measured.

Since the method of the present invention is capable of visualizing the energy loss of the golf ball, irrespective of the structure and material thereof, the method allows designing of golf balls having various structures and made of various materials without trial manufacture.

In the embodiment, the physical property of a material for a golf ball is measured by the split Hopkinson's bar tester. However the physical property (Young's modulus, loss factor, etc.) of the material may be found by a measuring method other than the split Hopkinson's bar tester, provided that the measuring method is capable of straining a specimen in a high extent and at a high speed and measuring its physical property in a condition of a maximum compression strain and a maximum strain speed equivalent to those generated when a golf ball is actually hit with an actual golf club head.

EXAMPLE 1

The golf ball model of the example 1 having a diameter of 42.8 mm was used in an assumption of a one-piece ball containing high-cis polybutadiene rubber as its main component. A mixture of high-cis polybutadiene rubber (BR01 manufactured by JSR, 100 phr), zinc acrylate (ZDA) 31 phr, zincoxide (ZnO) 20 phr, dicumyl peroxide (DCP) 0.4 phr was compression-molded with a die having a diameter of 42.8 mm at 160° C. for 30 minutes to form a golf ball model.

The physical property (Young's modulus and loss factor) of the material containing the high-cis polybutadiene rubber as its main component was measured by the split Hopkinson's bar tester which will be described later (room temperature: 23° C., relative humidity: 50%, collision speed of impact bar: 25 m/s). The results of the measurement was that the value of the Young's modulus: 77.8 Mpa, the value of the loss factor: 0.5493, the value of the maximum compression strain: 0.2897, and the value of the maximum strain speed: 3908.1[1/s].

Figure 14:
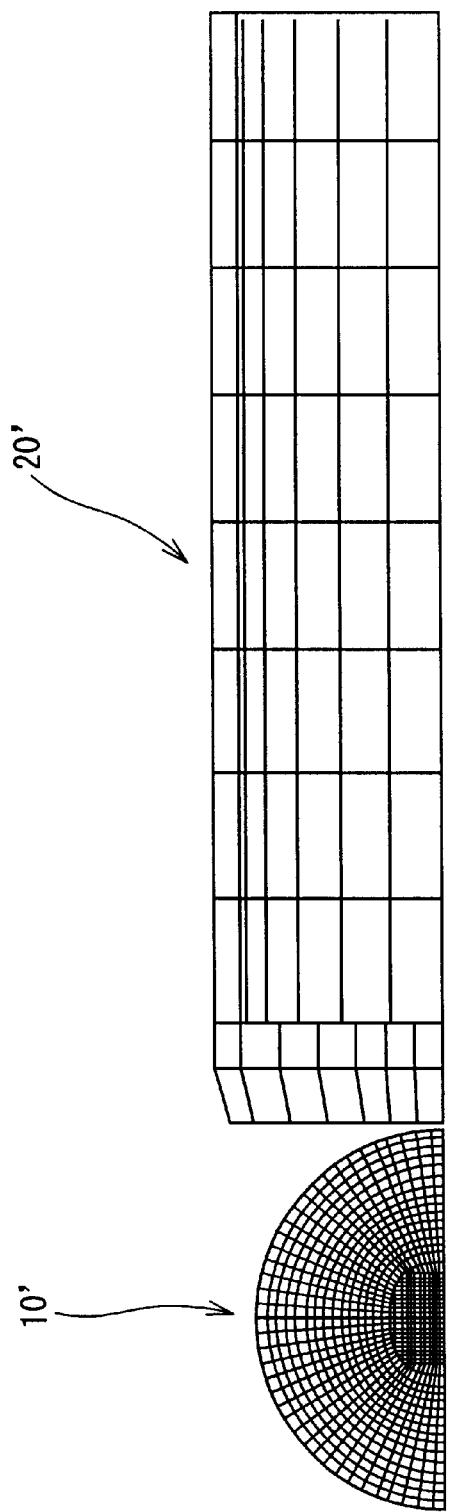
FIG. 14 shows a state when a golf ball model of a first embodiment collides with a hollow bar made of aluminum.
Figure 15:
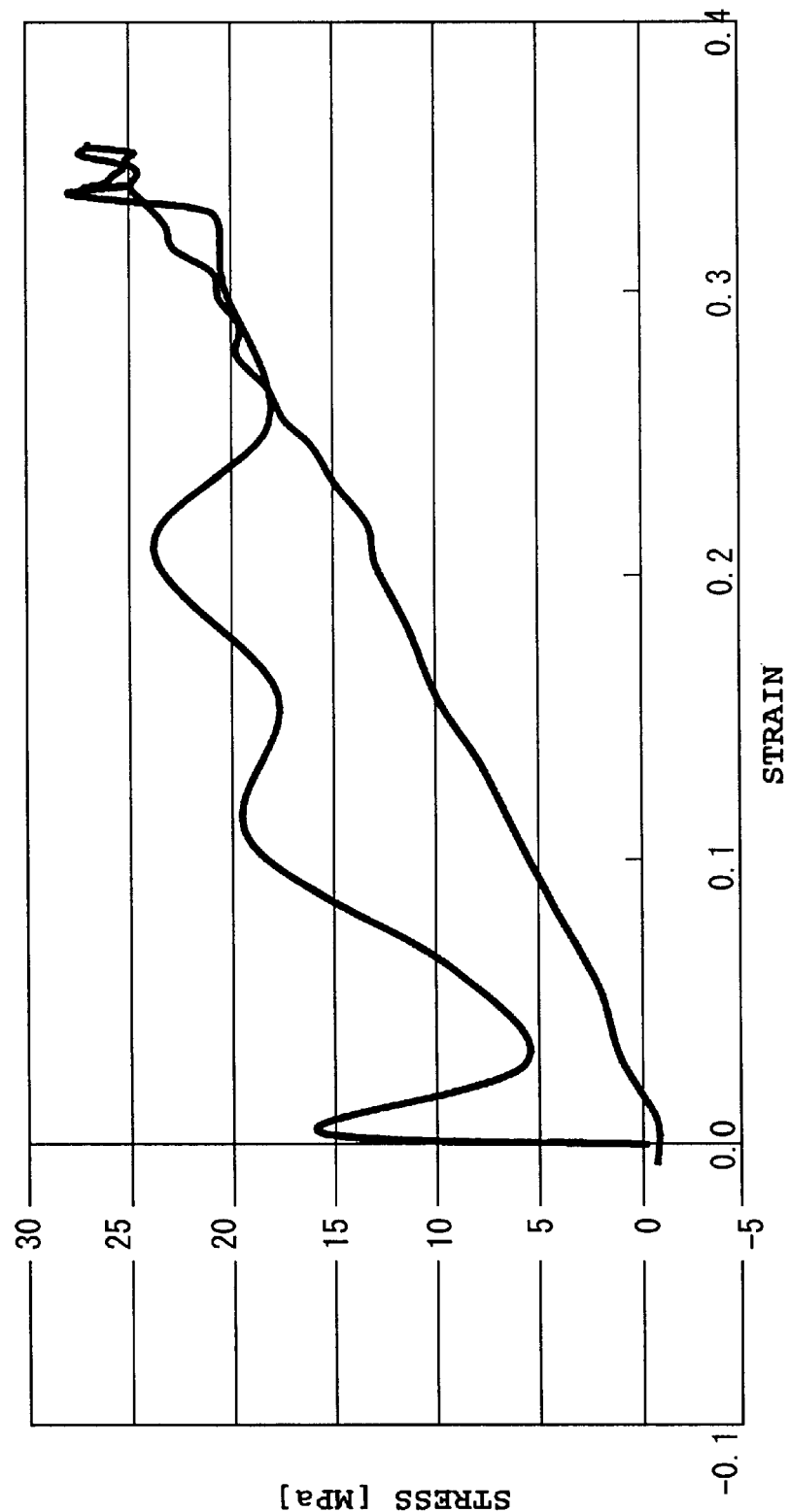
FIG. 15 shows the relationship between a stress and a strain of one component of one element of a golf ball model according to an example 1.

By using a method similar to the above-described embodiment, an energy loss was computed when an aluminum hollow bar model 20' collided with a golf ball model 10' at an initial speed of 45 m/s, as shown in FIG. 14. The golf ball model 10' was divided into 12797 elements. The element was a hexahedron. The size of the element was 0.5 mm–1.69 mm. The volume of the element was about 0.125 mm$^3$–2.73 mm$^3$. As shown in FIG. 15, a stress-strain curve of one of the elements of the golf ball model 10' in one direction was obtained.

Computing the value of the work amount difference L by using the equation (3), L=2.24 MPa.

By a method similar to the above-described method, the work amount difference L was computed for the other five directions to find the total of the work amount differences in the six directions. The total of the work amount differences in the six directions was multiplied by the volume $1.15 \times 10^{-9}$ m$^3$ of one element to obtain $2.602 \times 10^{-3}$ N·m as the energy loss of one element.

Figure 16:
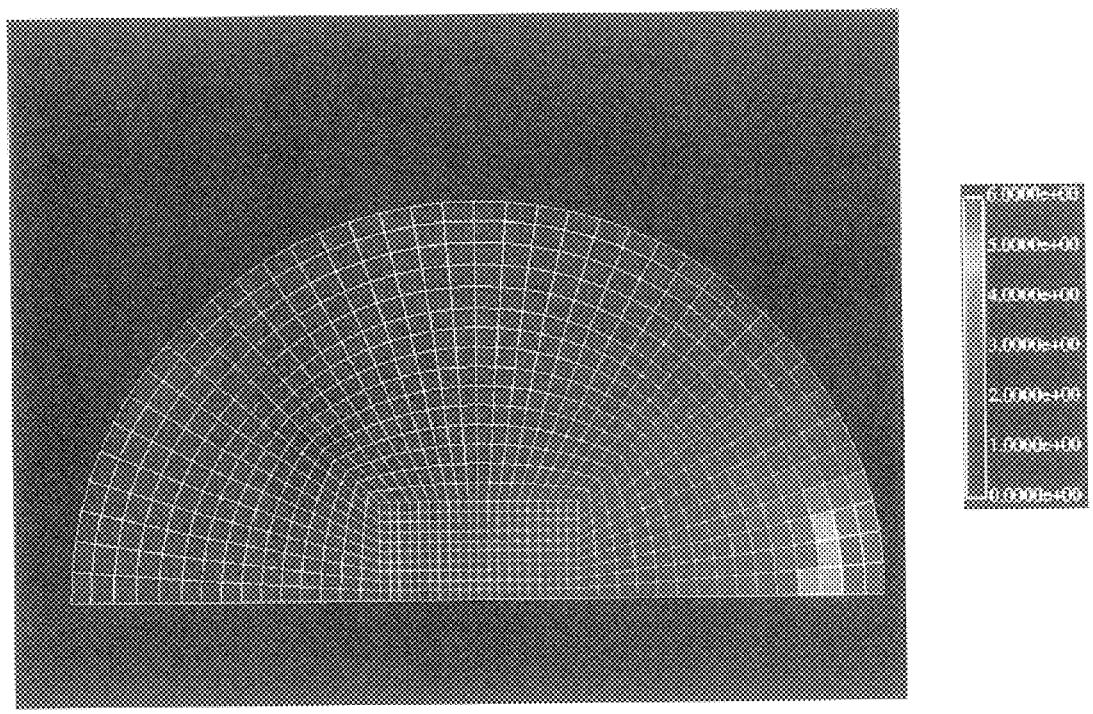
FIG. 16 shows a state in which an energy loss of each element of the golf ball model of the example 1 is visualized when the golf ball model and a hitting object collide with each other.

Similar computations were performed for all elements constituting the golf ball model to visualize energy values by the volume on a contour view shown in FIG. 16. In FIG. 16, the relationship between energy values [Mpa] and colors corresponding thereto are shown at a CONTOUR-LEVEL. A portion where the energy loss value of the element was not less than 6.0 Mpa was displayed in red, whereas a portion where the energy loss value of the element was small was displayed in blue. It was possible to confirm that the energy loss was great in the neighborhood of the point at which an aluminum hollow bar collided with the golf ball model. Thereby it was possible to confirm that the portion of the golf ball where the energy loss is greatest can be determined at a glance. The reason a plurality of colors are present for one element on the contour view is because energy loss values of the element are distributed to nodal points, and the values of adjacent elements are added thereto.

[Measurement Conducted by Split Hopkinson's Bar Tester to Measure Physical Property of Material]

Figure 17:
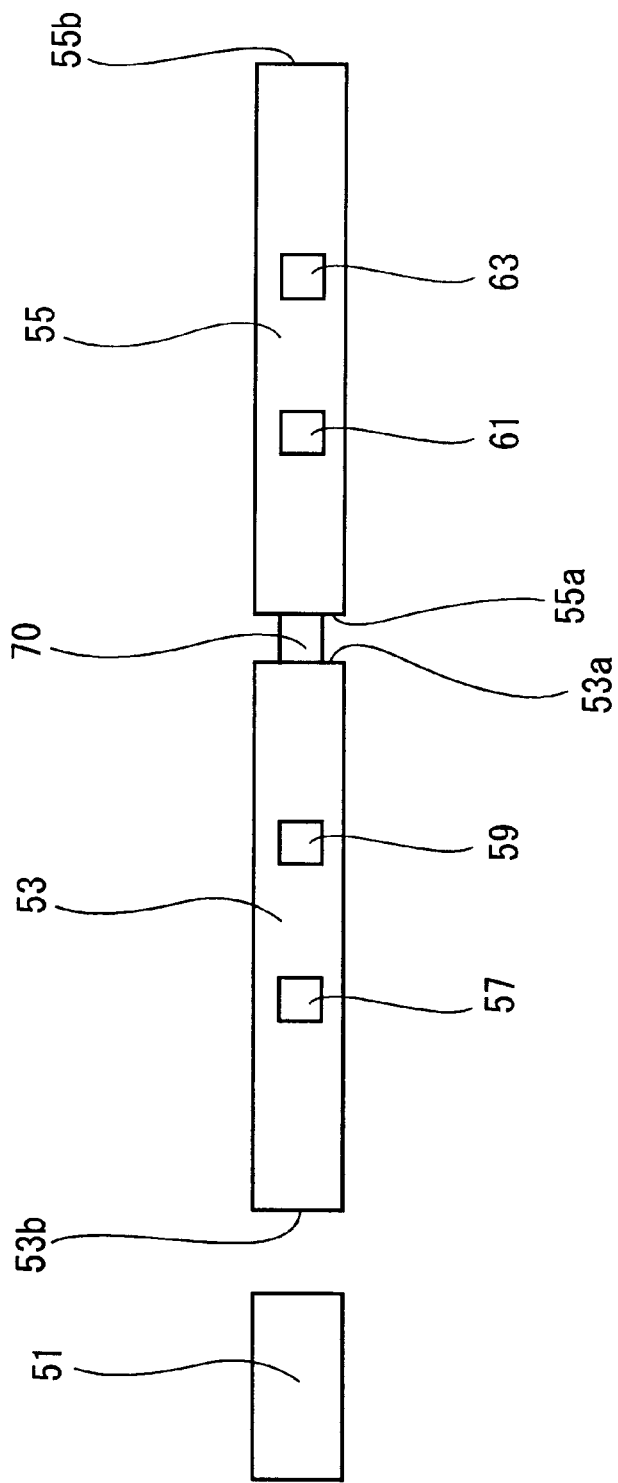
FIG. 17 is an illustrative front view showing a split Hopkinson's bar tester for measuring a physical property such as Young's modulus, a loss factor, and the like of a material.

FIG. 17 is an illustrative front view showing a split Hopkinson's bar tester for measuring physical properties (Young's modulus, loss factor, etc.) of a material necessary for executing an analysis based on the finite element method in carrying out the energy loss evaluation method of the of the present invention.

The split Hopkinson's bar tester shown in FIG. 17 has an impact bar 51, an input bar 53, and an output bar 55. These bars are arranged linearly. A first strain gauge 57 and a second strain gauge 59 are installed on the input bar 53. A third strain gauge 61 and a fourth strain gauge 63 are installed on the output bar 55. A columnar specimen 70 is sandwiched between a rear end 53a of the input bar 53 and a front end 55a of the output bar 55.

The specimen 70 may be formed by molding a material consisting of a rubber composition to be used for the golf ball into a predetermined configuration thereof or cutting a spherically formed golf ball. In the embodiment, the specimen 70 has a length (distance between the rear end 53a of the input bar 53 and the front end 55a of the output bar 55) of 4 mm and a sectional diameter of 18 mm.

The impact bar 51, the input bar 53, and the output bar 55 are cylindrical and made of polymethyl methacrylate. The sectional diameter of each of the input bar 53 and the output bar 55 is set to 20 mm. The modulus of direct elasticity of each of the input bar 53 and the output bar 55 is set to 5300 Mpa. The specific gravity of each of the input bar 53 and the output bar 55 is set to 1.19. The length of the impact bar 51 is set to 100 mm. The length of each of the input bar 53 and the output bar 55 (hereinafter may be referred to as stress bar) is set to 2000 mm.

The first strain gauge 57 is installed on the input bar 53 at a position spaced 900 mm from the rear end 53a thereof. The second strain gauge 59 is installed on the input bar 53 at a position spaced 600 mm from the rear end 53a thereof. The third strain gauge 61 is installed on the output bar 55 at a position spaced 300 mm from the front end 55a thereof. The fourth strain gauge 63 is installed on the output bar 55 at a position spaced 600 mm from the front end 55a thereof.

In the split Hopkinson's bar tester shown in FIG. 17, the impact bar 51, the input bar 53, and the output bar 55 are made of synthetic resin consisting of polymethyl methacrylate. The input bar 53 and the output bar 55 are as long as 2000 mm. The distance between the first strain gauge 57 and the rear end 53a of the input bar 53 is long. The distance between the second strain gauge 59 and the rear end 53a of the input bar 53 is also long. Therefore, the split Hopkinson's bar tester is suitable for measuring the strain, the strain speed, and the stress of a viscoelastic material such as crosslinked rubber which is used for a golf ball.

A monoaxial strain gauge for plastic is used as the first strain gauge 57, the second strain gauge 59, the third strain gauge 61, and the fourth strain gauge 63. In the embodiment, a monoaxial strain gauge manufactured by Kyowa Dengyo Kabushiki Kaisha is used. The monoaxial strain gauge is bonded to the above-described positions of the input bar 53 and the output bar 55. The first strain gauge 57 through the fourth strain gauge 63 are installed on the input bar 53 and the output bar 55 linearly in the longitudinal direction thereof.

In measuring the physical property of the material such as Young's modulus and the loss factor by the split Hopkinson's bar tester, initially, the impact bar 51 is brought into collision with the front end 53b of the input bar 53 at a speed of 25 m/s. Thereby, an incident distorted wave is generated in the input bar 53. The incident distorted wave advances to the rear end 53a of the input bar 53. A part of the incident distorted wave is reflected from the rear end 53a of the input bar 53 to generate a reflected distorted wave. The reflected distorted wave advance to the front end 53b of the input bar 53. A part of the incident distorted wave advances to the specimen 70 from the rear end 53a of the input bar 53 and propagates to the output bar 55 to generate a transmitted distorted wave. The transmitted distorted wave advances to the rear end 55b of the output bar 55.

The incident distorted wave is measured with the first strain gauge 57 and the second strain gauge 59. The incident distorted wave is passed through a low-pass filter to remove a high-frequency wave having a frequency more than 10 KHz from the incident distorted wave. Zero compensation is performed to make the base line value of the time history of the incident distorted wave zero. Fourier transformation of an obtained time base strain at each of the first strain gauge 57 and the second strain gauge 59 is performed to determine a frequency axis strain. A transmission function is derived from the frequency axis strain at the first strain gauge 57 and the second strain gauge 59. Based on the transmission function, the frequency axis strain at the rear end 53a of the input bar 53 is estimated in consideration of the ratio of the distance X1 between the first strain gauge 57 and the rear end 53a of the input bar 53 to the distance X2 between the second strain gauge 59 and the rear end 53a of the input bar 53. Fourier inverse transformation of the frequency axis strain is performed to obtain a time base strain (time history of strain) ∈i of the incident distorted wave at the rear end 53a of the input bar 53.

Similarly, the second strain gauge 59 and the first strain gauge 57 measure the reflected distorted wave reflected from the rear end 53a of the input bar 53 and advancing to the front end 53b of the input bar 53. A time base strain (time history of strain) ∈r of the reflected distorted wave at the rear end 53a of the input bar 53 is obtained from the measured reflected distorted wave.

The transmitted distorted wave which propagates to the output bar 55 through the specimen 70 is measured with the third strain gauge 61 and the fourth strain gauge 63 installed on the output bar 55. A time base strain (time history of strain) ∈t of the transmitted distorted wave at the front end 55a of the output bar 55 is obtained from the measured transmitted distorted wave.

From the obtained time base strains ∈i, ∈r, and ∈t, a strain speed ∈' of the specimen 70 is computed by using an equation (5) shown below.

(Equation 5)

$$\varepsilon' = (C_0/L) \cdot (\varepsilon i - \varepsilon r - \varepsilon t) \quad (5)$$

$$= \left((E/\rho)^{\frac{1}{2}} / L\right) \cdot (\varepsilon i - \varepsilon r - \varepsilon t)$$

where $C_0$ indicates the propagation speed (m/s) of the strain wave in the stress bar and the output bar, L indicates the length (m) of the specimen, E is the modulus of direct elasticity (N/m$^2$) of the stress bar, and $\rho$ is the density (kg/m$^3$) of the stress bar.

From the time base strains ∈i, ∈r, ∈t, the strain ∈ of the specimen 70 is computed by using an equation (6) shown below.

(Equation 6)

$$\varepsilon = (CO/L) \cdot \int_0^t (\varepsilon_i - \varepsilon_r - \varepsilon_t) dt \quad (6)$$

$$= \left((E/\rho)^{\frac{1}{2}} / L\right) \cdot \int_0^t (\varepsilon_i - \varepsilon_r - \varepsilon_t) dt$$

where $C_0$ indicates the propagation speed (m/s) of the strain wave in the stress bar and the output bar, L indicates the length (m) of the specimen, E is the modulus of direct elasticity (N/m$^2$) of the stress bar, and $\rho$ is the density (kg/m$^3$) of the stress bar.

From the time base strains ∈i, ∈r, and ∈t, the stress σ of the specimen 70 is computed by using an equation (7) shown below.

$$\sigma = = (E \cdot A/(2As)) \cdot (\varepsilon i + \varepsilon r + \varepsilon t) \quad (7)$$

$$= (E \cdot D^2/(2(Ds)^2)) \cdot (\varepsilon i + \varepsilon r + \varepsilon t)$$

where E indicates the modulus of direct elasticity (N/m$^2$) of the stress bar consisting of the input bar and the output bar; A indicates the sectional area (m$^2$) of the stress bar; As indicates the sectional area (m$^2$) of the specimen; D indicates the diameter (m) of the stress bar; and Ds indicates the diameter (m) of the specimen.

Figure 18:
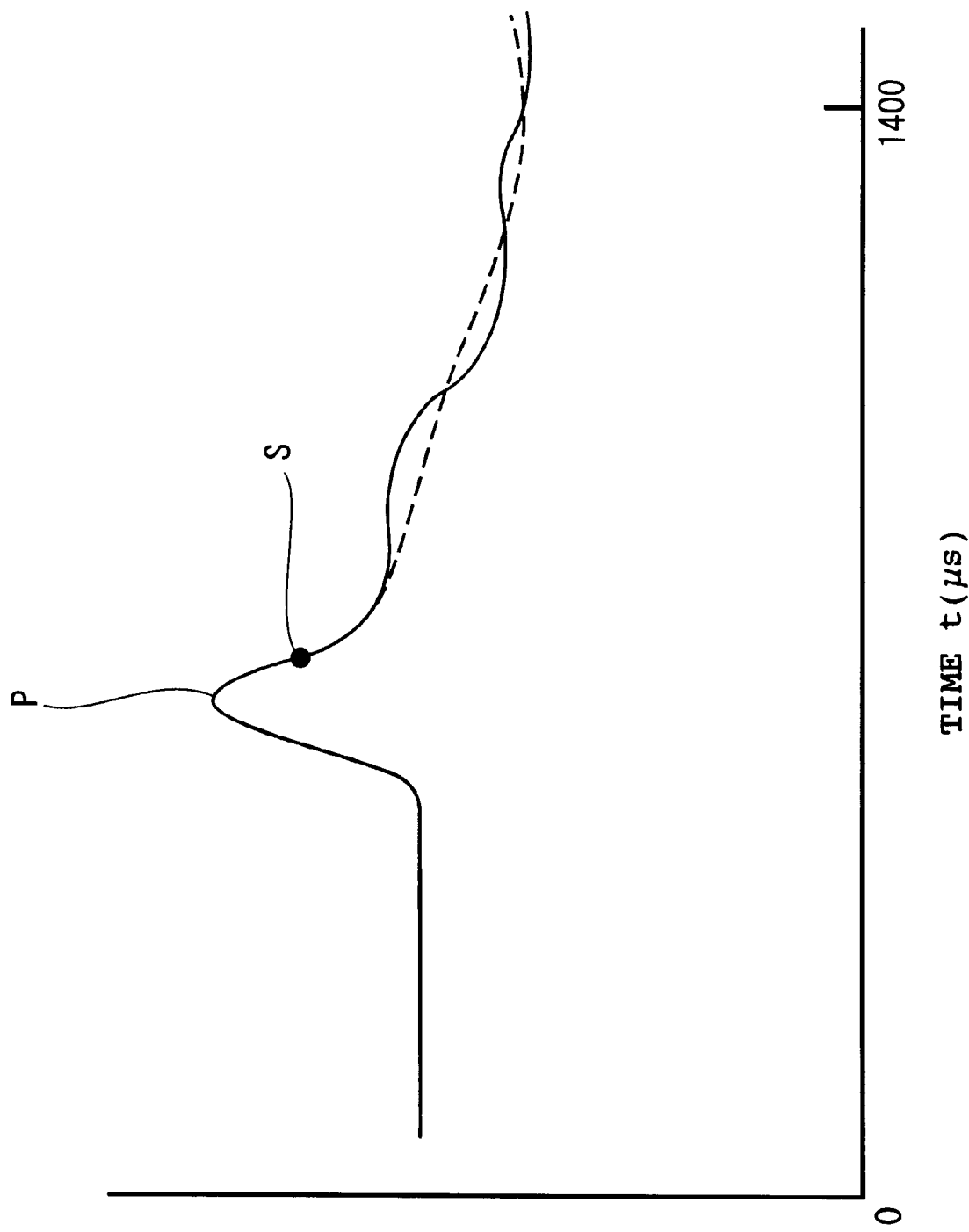
FIG. 18 is a graph showing the state of a time history of a strain of a specimen.

FIG. 18 shows the obtained strain time history of the specimen 20. As shown in FIG. 18, the curve is smooth for a certain period of time after a time corresponding to a peak P. After a time corresponding to a given point of the graph FIG. 18, the curve becomes irregular. A point S is selected in the curve-smooth stage between the peak P and the given point. A tangent to the curve at the point S is drawn. A relaxation time λ is derived from the intersection of the tangent and the time base. A curve found by using an equation (8) shown below is determined as the curve after the point S of FIG. 18. In this manner, the entire strain time history is corrected to a smooth curve (shown with a one-dot line in FIG. 18). Thereby, it is possible to remove the influence of noise on an obtained viscoelastic characteristic value.

(Equation 8)

$$\epsilon(t) = \epsilon 0 \cdot e^{-t/\lambda} \quad (8)$$

where ∈0 is a strain at the point of contact.

Similarly, it is possible to make an entire stress time history a smooth curve by using an equation (9) shown below. Thereby, it is possible to remove the influence of noise on an obtained physical property (Young's modulus and loss factor) of the material.

(Equation 9)

$$\sigma(t) = \sigma 0 \cdot e^{-t/\lambda} \quad (9)$$

where σ0 is a stress at the point of contact.

Figure 19:
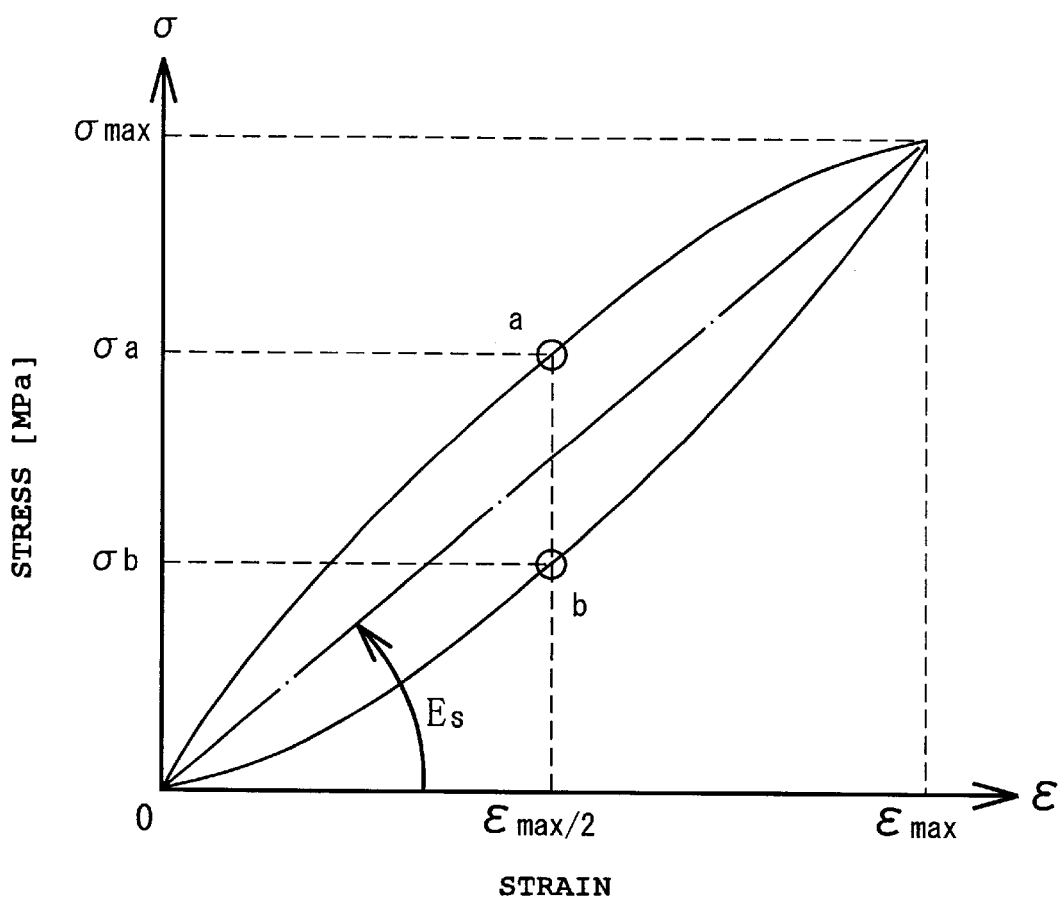
FIG. 19 is a graph showing a stress-strain curve obtained when the split Hopkinson's bar tester measures the physical property of the material.

A stress-strain curve is determined from the strain time history and the stress time history of the specimen 70 obtained by performing the above compensation. FIG. 19 is a graph showing a typical stress-strain curve. From the stress-strain curve, the Young's modulus Es of the specimen 70 is computed by using an equation (10) shown below.
(Equation 10)

$$Es = \sigma max / \epsilon max \quad (10)$$

From the stress-strain curve of FIG. 19, a phase angle δ is computed by using an equation (11) shown below:
(Equation 11)

$$\delta = \sin^{-1}((\sigma a - \sigma b)/\sigma max) \quad (11)$$

A loss factor (tan δ) is computed from the phase angle δ.

The maximum strain speed of the specimen and the maximum compression strain thereof at the time when the impact bar collided with the front end of the input bar at a speed of 25 m/s was in the range of 2000/s to 2500/s and in the range of 0.15 to 0.25 respectively. The deforming behavior of the strain is close to that of the strain of the golf ball at the time when it is hit. That is, physical properties of the material such as the Young's modulus and the loss factor measured by the split Hopkinson's bar tester are close to those in the state in which the golf ball is actually hit with a golf club head.

The collision speed of the impact bar is not limited to 25 m/s, but it is possible to select another collision speed, provided that the deforming behavior of the strain of the specimen that has collided with the impact bar is close to that of the strain of the golf ball at the time when it is hit.

As apparent from the foregoing description, according to the present invention, it is possible to actually observe and estimate the energy loss generated inside the golf ball when a hitting object has collided (impacted) therewith. Therefore it is possible to estimate and observe a portion (for example, a portion of the cover of the golf ball or in the center thereof) of the interior of the golf ball and the extent of the generated energy loss. Thereby the energy loss can be used as data useful for improving the restitution performance of the golf ball.

Since a simulation is executed by using the finite element method, it is unnecessary for making golf balls by way of trial and it is easy to design golf balls of various types. Thereby it is possible to save cost and time required in making golf balls by way of trial.

Therefore the present invention is capable of providing a golf ball generating a small energy loss when the hitting object collides with the golf ball. That is, it takes a short period of time to manufacture the golf ball having an optimum restitution performance.

What is claimed is:

1. A method of evaluating an energy loss of a golf ball, comprising the steps of:

dividing a golf ball model into a large number of elements composed of a large number of nodal points in the form of meshes; inputting a physical property of a material for said golf ball; executing a simulation by an analysis based on a finite element method, assuming that a golf club head collides with said golf ball; and computing a strain amount generated in said golf ball model at the time of said collision;

outputting a stress and a strain component of each element of said golf ball model and coordinate values of said nodal points of each element; and momently computing a value of a stress and a strain of each of six components of each element;

finding a relationship between said stress and said strain of each component of each element from said value of said stress and said strain of each of said six components; and computing energy loss values of each element; and computing said energy loss value for all elements included in said golf ball model; reading said computed energy loss value by a visualizing software; and visualizing said energy loss of said golf ball model.

2. The method according to claim 1, wherein in visualizing said energy loss, a deformed configuration of said golf ball model is displayed, based on said coordinate values of said nodal points of each element.

3. The method according to claim 1, wherein said physical property of said material is measured in a condition of a strain and a strain speed equivalent to those generated when said golf ball is actually hit with an actual golf club head.

4. The method according to claim 1, wherein said physical property of said material is measured with a split Hopkinson's bar tester in a condition of a strain and a strain speed equivalent to those generated when said golf ball is actually hit with an actual golf club head.

5. The method according to claim 1, wherein physical properties such as Young's modulus, a shear coefficient, a viscosity coefficient, and loss factor relating to a rigidity and viscosity of said material are measured.

6. The method according to claim 1, wherein in visualizing said energy loss, the energy loss values of each element are classified by color and a difference in said energy losses is displayed by different colors on a contour view.

7. The method according to claim 1, wherein said physical properties of said material are measured in a condition in which a maximum compression strain is 0.05–0.50 or/and a maximum strain speed is 500/s to 10000/s.

8. The method according to claim 1, wherein said golf ball is a one-piece golf ball consisting of one layer such as a cross-linked rubber layer, a two-piece golf ball composed of two layers such as said cross-linked rubber layer and a cover covering said cross-linked rubber layer or a multi-piece golf ball composed of three or more layers.

9. The method according to claim 1, wherein said six components is constituted of three components in a vertical direction and three components in a shear direction in a three-dimensional space, and the energy loss of each element is visualized and displayed three-dimensionally.

10. The method according to claim 1, wherein the value of the energy loss is computed from the difference between a work amount in a strain-increase direction and a work amount in a strain-decrease direction at the collision.

* * * * *